United States Patent
Doan et al.

[11] Patent Number: 6,100,144
[45] Date of Patent: *Aug. 8, 2000

[54] SEMICONDUCTOR PROCESSING METHOD OF PROVIDING ELECTRICAL ISOLATION BETWEEN ADJACENT SEMICONDUCTOR DIFFUSION REGIONS OF DIFFERENT FIELD EFFECT TRANSISTORS AND INTEGRATED CIRCUITRY HAVING ADJACENT ELECTRICALLY ISOLATED FIELD EFFECT TRANSISTORS

[75] Inventors: Trung Tri Doan, Boise; Charles H. Dennison, Meridian, both of Id.

[73] Assignee: Micron Technology, Inc., Boise, Id.

[*] Notice: This patent is subject to a terminal disclaimer.

[21] Appl. No.: 09/257,878

[22] Filed: Feb. 25, 1999

Related U.S. Application Data

[63] Continuation of application No. 08/633,030, Apr. 16, 1996, Pat. No. 5,895,243.

[51] Int. Cl.[7] .................................................. H01L 21/336
[52] U.S. Cl. ........................ 438/297; 438/301; 438/303; 438/305; 438/306; 438/307
[58] Field of Search ................................... 438/297, 303, 438/301, 299, 305, 306, 307

[56] References Cited

U.S. PATENT DOCUMENTS

| | | |
|---|---|---|
| 4,642,880 | 2/1987 | Mizutani et al. . |
| 4,679,303 | 7/1987 | Chen et al. . |
| 4,701,423 | 10/1987 | Szluk . |
| 4,890,147 | 12/1989 | Teng et al. . |
| 4,963,502 | 10/1990 | Teng et al. . |
| 4,987,093 | 1/1991 | Teng et al. . |
| 5,043,778 | 8/1991 | Teng et al. . |
| 5,053,349 | 10/1991 | Matsuoka . |
| 5,439,835 | 8/1995 | Gonzalez . |
| 5,451,804 | 9/1995 | Lur et al. . |
| 5,523,250 | 6/1996 | Jeong et al. . |
| 5,554,549 | 9/1996 | Huang . |
| 5,895,243 | 4/1999 | Doan et al. ............................ 438/297 |

*Primary Examiner*—Trung Dang
*Attorney, Agent, or Firm*—Wells, St. John, Roberts, Gregory & Matkin P.S.

[57] ABSTRACT

A semiconductor processing method of providing electrical isolation between adjacent semiconductor diffusion regions of different field effect transistors includes, a) providing an electrically insulative device isolation mass between opposing active area regions, the insulative isolation mass having opposing laterally outermost edges; and b) providing a pair of electrically conductive transistor source/drain diffusion regions within the active area regions, one of the conductive source/drain diffusion regions being received within one of the active area regions and being associated with one field effect transistor, the other of the conductive source/drain diffusion regions being received within the other of the active area regions and being associated with another field effect transistor, the electrically conductive source/drain diffusion regions each having an outermost edge adjacent the insulative isolation mass, such source/drain diffusion regions edges being received within the respective active area regions spaced from the respective mass laterally outermost edges to space the transistor source/drain diffusion regions edges away from the isolation mass. Integrated circuitry having adjacent electrically isolated field effect transistors produced according to the method and other methods is also disclosed. The invention also contemplates spacing one electrically conductive (heavy implant) diffusion region of one of adjacent field effect transistors away from the device isolation mass. Regardless, preferred spacing of the implant from the device isolation is at least 0.01 micron.

7 Claims, 4 Drawing Sheets

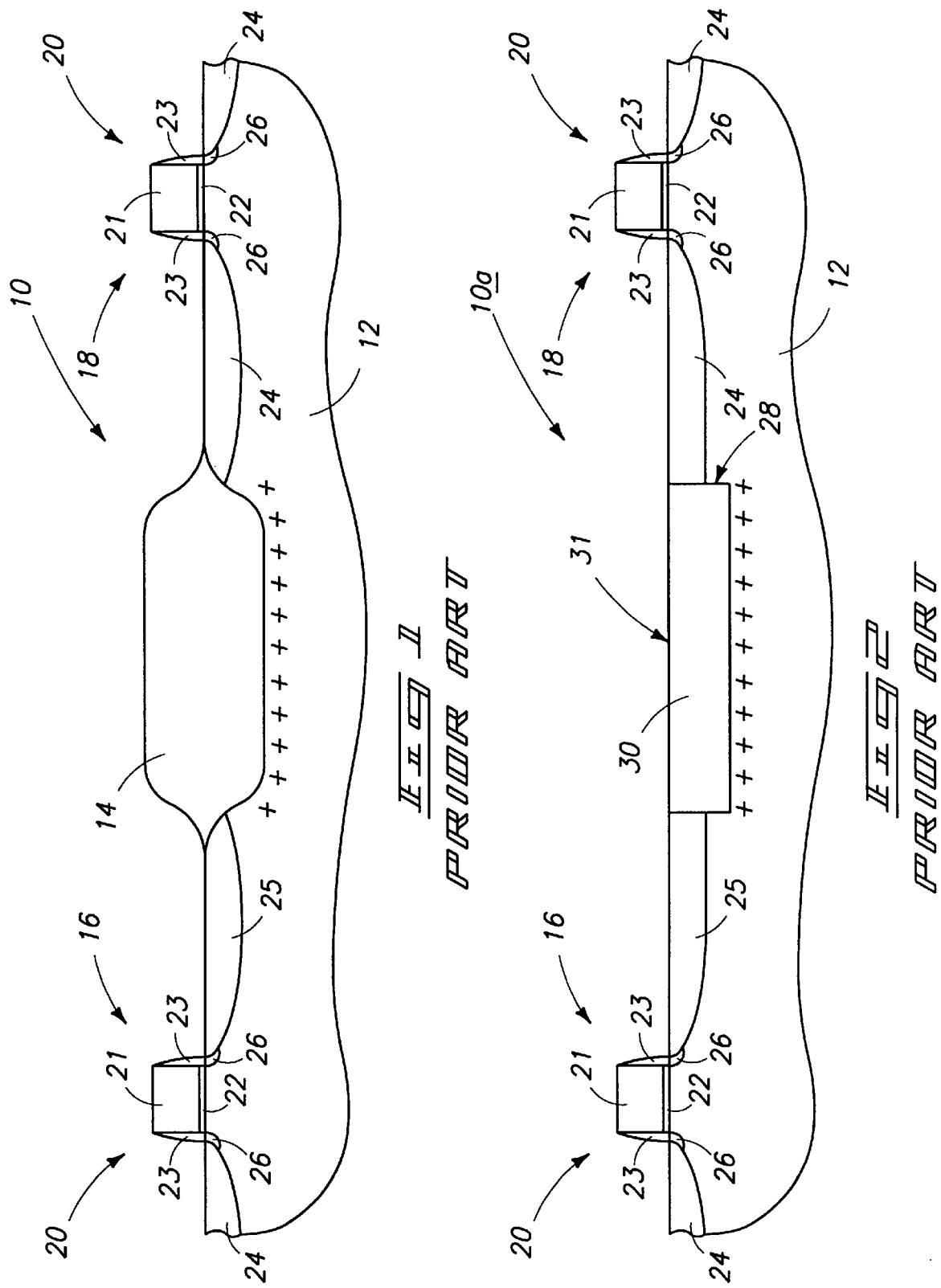

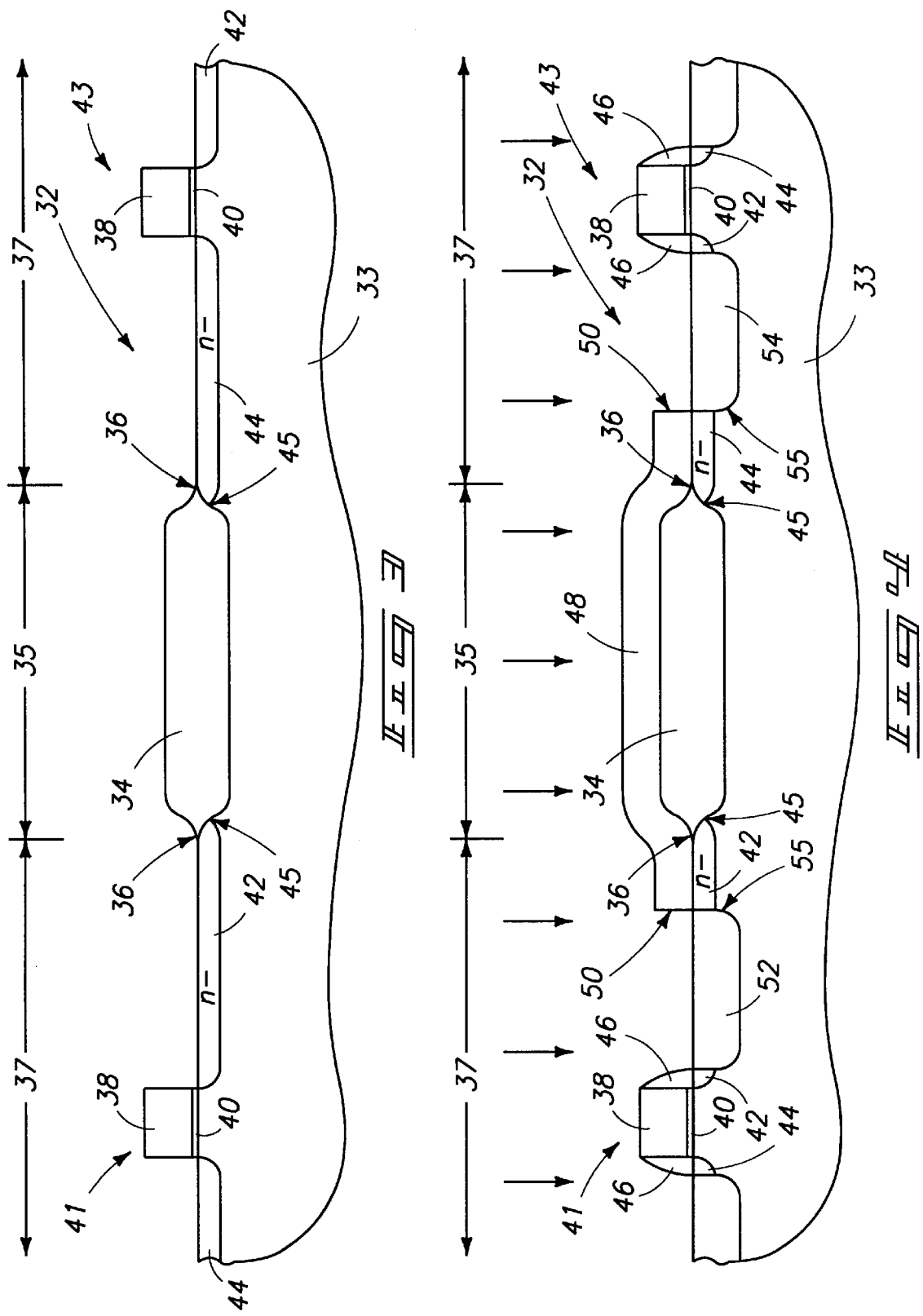

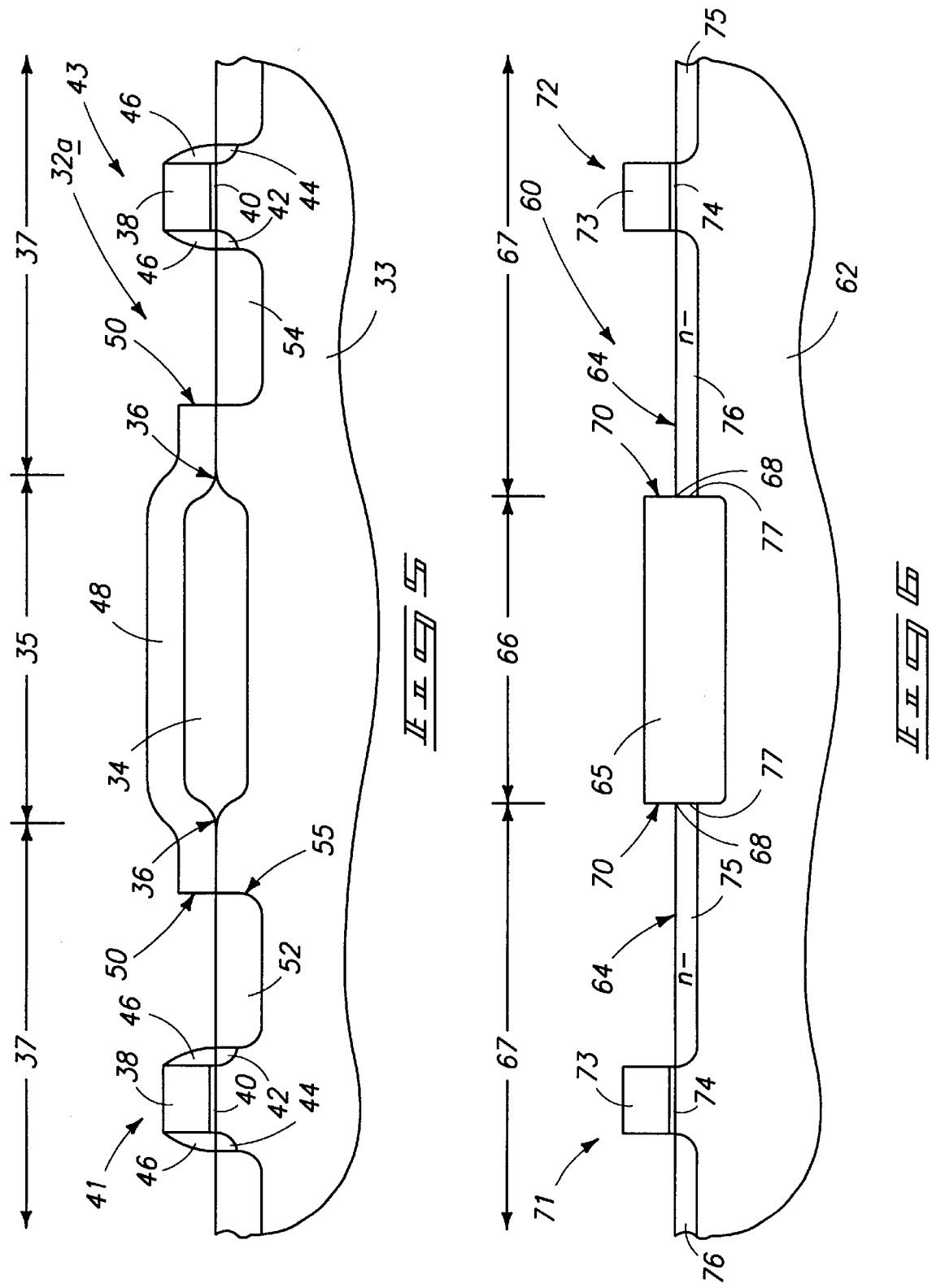

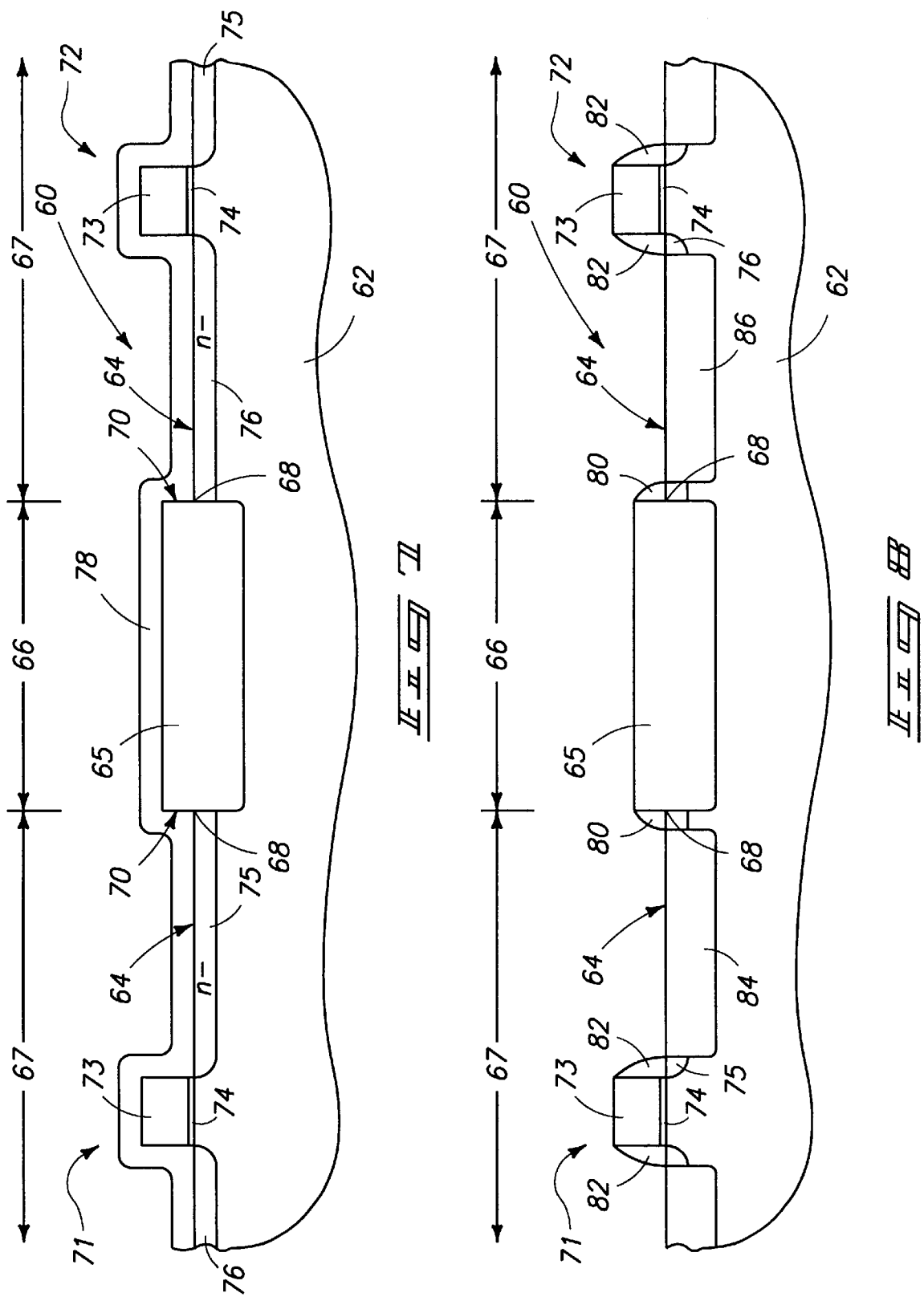

SEMICONDUCTOR PROCESSING METHOD OF PROVIDING ELECTRICAL ISOLATION BETWEEN ADJACENT SEMICONDUCTOR DIFFUSION REGIONS OF DIFFERENT FIELD EFFECT TRANSISTORS AND INTEGRATED CIRCUITRY HAVING ADJACENT ELECTRICALLY ISOLATED FIELD EFFECT TRANSISTORS

RELATED PATENT DATA

This patent application is a continuation of U.S. patent application Ser. No. 08/633,030, filed Apr. 16, 1996, entitled "Semiconductor Processing Method of Providing Electrical Isolation Between Adjacent Semiconductor Diffusion Regions of Different Field Effect Transistors and Integrated Circuitry Having Adjacent Electrically Isolated Field Effect Transistors", naming Trung Tri Doan and Charles H. Dennison as inventors, and which is now U.S. Pat. No. 5,895,243 the disclosure of which is incorporated by reference.

TECHNICAL FIELD

This invention relates to semiconductor processing methods of providing electrical isolation between adjacent semiconductor diffusion regions of different field effect transistors and integrated circuitry having adjacent electrically isolated field effect transistors.

BACKGROUND OF THE INVENTION

Implementing electric circuits involves connecting isolated devices or electronic components through specific electrical paths. When fabricating integrated circuits from semiconductor materials, such as silicon, it must therefore be possible to isolate devices built into the substrate from one another. Such devices are subsequently electrically interconnected to create the specific circuit configurations desired.

A variety of techniques have been developed to isolate devices in integrated circuits. Different integrated circuit types can require somewhat different isolation requirements. For example, PMOS and NMOS integrated circuits require an isolation structure that prevents the establishment of parasitic channels between adjacent transistor devices. MOS transistors are inherently self-isolated.

As long as the source-substrate and drain-substrate pn junctions are held at reverse bias in MOS transistors, the drain current ($I_D$) should only be due to current flow from source to drain through a channel under the gate. This further implies that no significant current between adjacent MOS devices should exist if no channels exist between them. However, the method by which the components of an integrated circuit are interconnected involves the fabrication of conductive lines that run across oxide in the regions between the transistors, typically referred to as field oxide or field regions. Unfortunately, these conductive lines have a tendency to form gates of parasitic MOS transistors, with the oxide beneath them forming a gate oxide and the diffused regions of separate transistors adjacent the field regions acting as parasitic sources and drains. The threshold voltage of such parasitic transistors is kept higher than any possible operating voltage so that spurious channels will not be inadvertently formed between transistor devices. Two techniques for increasing the threshold voltage are increasing the field-oxide thickness and raising the doping concentration of the bulk substrate area beneath the field oxide.

Typical prior art isolation technology is described with reference to FIGS. 1 and 2. Referring first to FIG. 1, a semiconductor wafer fragment 10 is comprised of a bulk monocrystalline silicon substrate 12 and an isolating field oxide region 14 positioned between a pair of field effect transistor devices 16 and 18. Such transistors each comprise respective gate constructions 20, composed of a conductive portion 21, an underlying gate dielectric layer 22, and opposing insulating sidewall spacers 23. Each transistor is provided with a pair of electrically conductive n+ source/drain diffusion regions 24 and 25. Example dopant concentration for regions 24 and 25 is $1 \times 10^{20}$ ions/cm$^3$ or greater. Bulk substrate or well area 12 is provided to a p-concentration, such as $1 \times 10^{15}$ ions/cm$^3$. Transistors 16 and 18 are also provided with n-lightly doped drain (LDD) regions 26. Example concentration for regions 26 is $1 \times 10^{17}$ ions/cm$^3$. Immediately beneath field oxide region 14, an implant has been conducted to provide a higher concentration of p-type material, indicated by the plurality of "+" symbols therebeneath. Such effectively raises the threshold voltage for preventing a parasitic transistor from forming beneath oxide 14 utilizing the adjacent regions 24 and 25 as parasitic sources and drains.

FIG. 2 illustrates an alternate prior art isolation process, referred to as buried-oxide (BOX) isolation technology. Like numerals are utilized from the first described embodiment where appropriate, with differences being indicated with different numerals or with the suffix "a". Buried-oxide isolation technology typically uses shallow trenches 28 formed within bulk substrate 12 which are refilled with a chemical vapor deposited $SiO_2$ layer 30. This layer is then etched back to yield the illustrated planar upper surface 31.

This invention comprises improved techniques for providing electrical isolation between adjacent semiconductor diffusion regions of different field effect transistors.

BRIEF DESCRIPTION OF THE DRAWINGS

Preferred embodiments of the invention are described below with reference to the following accompanying drawings.

FIG. 1 is a diagrammatic sectional view of one prior art semiconductor wafer fragment at a prior art processing step, and is discussed in the "Background" section above.

FIG. 2 is a diagrammatic sectional view of one prior art semiconductor wafer fragment at a prior art processing step, and is discussed in the "Background" section above.

FIG. 3 is a diagrammatic sectional view of a semiconductor wafer fragment at one processing step in accordance with the invention.

FIG. 4 is a view of the FIG. 3 wafer fragment at a processing step subsequent to that shown in FIG. 3.

FIG. 5 is a diagrammatic sectional view of an alternate embodiment semiconductor wafer fragment at one alternate processing step in accordance with the invention.

FIG. 6 is a diagrammatic sectional view of another alternate embodiment semiconductor wafer fragment at another alternate processing step in accordance with the invention.

FIG. 7 is a view of the FIG. 6 wafer fragment at a processing step subsequent to that shown by FIG. 6.

FIG. 8 is a view of the FIG. 6 wafer fragment at a processing step subsequent to that shown by FIG. 7.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with one aspect of the invention, a semiconductor processing method of providing electrical isolation between adjacent semiconductor diffusion regions of different field effect transistors comprises the following steps:

provideing an electrically insulative device isolation mass between opposing active area regions, the insulative isolation mass having opposing laterally outermost edges; and providing a pair of electrically conductive transistor source/drain diffusion regions within the active area regions, one of the conductive source/drain diffusion regions being received within one of the active area regions and being associated with one field effect transistor, the other of the conductive source/drain diffusion regions being received within the other of the active area regions and being associated with another field effect transistor, the electrically conductive source/drain diffusion regions each having an outermost edge adjacent the insulative isolation mass, such source/drain diffusion regions edges being received within the respective active area regions spaced from the respective mass laterally outermost edges to space the transistor source/drain diffusion regions edges away from the isolation mass.

In accordance with another aspect of the invention, integrated circuitry having adjacent electrically isolated field effect transistors comprises:

an electrically insulative device isolation mass received between opposing active area regions, the insulative isolation mass having opposing laterally outermost edges; and a pair of field effect transistors, one field effect transistor being received within one active area, the other field effect transistor being received within the other active area;

a pair of electrically conductive transistor source/drain diffusion regions within the active area regions, one of the conductive source/drain diffusion regions being received within the one active area region and being associated with the one field effect transistor, the other of the conductive source/drain diffusion regions being received within the other active area region and being associated with the other field effect transistor, the electrically conductive source/drain diffusion regions each having an outermost edge adjacent the insulative isolation mass, such source/drain diffusion regions edges being received within the respective active area regions spaced from the respective mass laterally outermost edges to space the transistor source/drain diffusion regions edges away from the isolation mass.

A first described embodiment is shown in FIGS. 3 and 4. Referring first to FIG. 3, a semiconductor wafer fragment 32 in process is comprised of a bulk semiconductor substrate 33. An electrically insulative field oxide region 34 has been grown within bulk substrate 33 to effectively define an electrical isolation region 35 positioned between opposing substrate active area regions 37 extending laterally outward of isolation region 35. For purposes of the continuing discussion, field oxide region 34 and the respective active area regions 37 join at respective interface edges 36. A pair of transistor gates 41 and 43 are shown comprising respective conductive regions 38 and gate oxide regions 40. Ion implanting is conducted to produce a pair of n- LDD diffusion regions 42 and 44 received within the respective active area regions 37. LDD diffusion regions 42 and 44 each have an outermost edge 45 adjacent and abutting against field oxide region 34.

Referring to FIG. 4, electrically insulating sidewall spacers 46 have been provided relative to conductive gate layer 38 and gate oxide layer 40. A photoresist masking layer 48 has been deposited and patterned over field oxide region 34. Photoresist mask 48 has lateral outermost edges 50 spaced laterally outward within active area regions 37 beyond the respective interface edges 36.

With photoresist mask 48 in place, ion implanting of a conductivity enhancing dopant impurity is conducted into unmasked areas of substrate active area regions 37 to a concentration effect to form a pair of electrically conductive transistors source/drain diffusion regions 52 and 54. An example and preferred resultant implant concentration is again greater than or equal $1 \times 10^{20}$ ions/cm$^3$. Conductive source/drain diffusion region 52 is received within the left illustrated active area region 37 and is associated with field effect transistor gate 41. Conductive source/drain diffusion region 54 is received within the right illustrated active area region 37 and is associated with field effect transistor 43. Each region 52 and 54 has an outermost edge 55 adjacent field oxide region 34. Such edges 55 are received within the respective active area regions 37, but spaced from respective interface edges 36 to space transistor source/drain diffusion regions edges 55 away from field oxide region 34.

The prior art heretofore has been understood to position such electrically conductive diffusion regions entirely against the intervening isolation field or trench oxide. Spacing such regions laterally away from the isolation oxide in accordance with the invention provides the advantage of producing higher junction breakdown voltage, effectively higher field threshold voltage and improved punch-through characteristics.

FIG. 5 illustrates an alternative embodiment 32a wherein even more isolation is provided by not providing the LDD diffusion regions 42, 44 against field oxide region 34. Such would however come at the added cost of an additional masking step.

An alternate embodiment is described with reference to FIGS. 6–8. First with reference to FIG. 6, there illustrated is a wafer fragment 60 comprised of a bulk semiconductor substrate 62 having an outer surface 64. A buried oxide electrically insulative device isolation mass 65 is provided within bulk substrate 62 to define an electrical isolation region 66 positioned between opposing substrate active area regions 67 extending laterally outward thereof. Insulated isolation mass 65 and the respective active area region 67 join at respective interface edges 68. Buried oxide mass 65 projects outwardly of substrate outer surface 64, and includes sidewalls 70 which project substantially perpendicularly from surface 64.

Gates 71 and 72 are provided, and respectively comprise a conductive region 73 and a gate oxide region 74. Ion implanting is preferably conducted to provide the illustrated pair of LDD diffusion regions 75 and 76. Such have outermost lateral edges 77 which abut insulation mass 65.

Referring to FIG. 7, a layer of material 78 is provided over substrate 62, buried oxide 65 projecting therefrom and its associated sidewalls 70, and gate 71 and 72. Layer 78 preferably predominantly comprises SiO$_2$. Alternately, layer 78 might comprise a nitride or material other than the same predominant composition of buried oxide electrically insulative device isolation mass 65.

Referring to FIG. 8, layer 78 is anisotropically etched to provide sidewall spacers 80 over sidewalls 70 of buried oxide mass 65 projecting from substrate outer surface 64, and sidewall spacers 82 about transistor gates 71 and 72. Subsequent heavy ion implanting is conducted to produce the illustrated pair of electrically conductive transistor source/drain diffusion regions 84 and 86 in a manner similar to the first described embodiment. Separate masking could also of course be conducted to provide no LDD diffusion region against electrically insulative device isolation mass 65.

The above described embodiments can facilitate provision of thinner electrically insulative device isolation masses between field effect transistors. For example with respect to each of the above described embodiments, the respective electrically insulative device isolation masses have their lowest or innermost respective bases provided below the bases of the LDD regions, but not necessarily below the bases of the heavy doped source/drain diffusion regions. In other words, spacing of the highly conductive source/drain diffusion region laterally from the device isolation mass can be utilized in certain design application to eliminate deeper implanted or formed oxide.

Further, the above described preferred embodiments have been described with respect to oxide or device isolation masses formed relative to bulk semiconductor substrates, and provision of diffusion regions thereon. Alternate processing might be conducted apart from bulk semiconductor procesing with formation of diffusion regions therein, with the invention only being limited by the accompanying claims appropriately interpreted in accordance with the doctrine of equivalence.

The invention also contemplates spacing one electrically conductive (heavy implant) diffusion region of one of adjacent field effect transistors away from the device isolation mass. Regardless, preferred spacing of the implant from the device isolation is at least 0.01 micron.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method for electrically isolating adjacent semiconductor diffusion regions, comprising:
   providing a semiconductor substrate;
   forming an electrically insulative field oxide region within the semiconductor substrate, the field oxide region defining an electrical isolation region which is positioned between two opposing substrate active areas, and wherein each of the opposing active areas and the field oxide region join at respective interface edges;
   after forming the field oxide region, providing a photoresist mask over the field oxide region, the photoresist mask having lateral outermost edges which are positioned in spaced relation relative to the respective interface edges, and within the respective active areas; and
   with the photoresist mask in place, ion implanting a conductivity enhancing dopant impurity into the active area regions to form source/drain regions in each of the active areas, the source/drain regions having an outermost edge being located within the respective active areas and spaced from the respective interface edges to locate the respective source/drain regions in spaced relation relative to the field oxide region.

2. A method as claimed in claim 1, and which further comprises:
   providing two discrete field effect transistors which are space from one another and formed on the substrate, and wherein the field oxide is provided between the two discrete field effect transistors, and wherein each active area region is associated with one of the discrete field effect transistors, and wherein the source/drain regions formed in each of the active areas are associated with one of the discrete field effect transistors.

3. A method as claimed in claim 1, and further comprising a LDD diffusion region which is received within each active area region and which is associated with each of the source/drain regions, the LDD diffusion region having an outermost edge which abuts the field oxide region.

4. A method as claimed in claim 1, and further comprising a LDD diffusion region which is received within each active area region and which is associated with each of the source/drain regions, the LDD diffusion region having an outermost edge which is spaced from the respective interface edges to space the LDD diffusion region away from the field oxide region.

5. A method as claimed in claim 1, and further comprising:
   a LDD diffusion region which is received within each active area region and which is associate with each of the source/drain region, and wherein each of the LDD diffusion regions, source/drain regions, and the field oxide region have an innermost base terminus, and wherein the innermost base terminus of the field oxide region is positioned between the innermost base terminus of each of the LDD diffusion regions, and the innermost base terminus of each of the source/drain regions.

6. A semiconductor processing method of providing electrical isolation between adjacent semiconductor diffusion regions of different field effect transistors, the method comprising:
   providing a semiconductor substrate;
   growing an electrically insulative field oxide region within the semiconductor substrate to define an electrical isolation region positioned between opposing substrate active area regions, the field oxide region and each of active area regions having an innermost base terminus, and joining at respective interface edges;
   after forming the field oxide region, providing a LDD diffusion region associated with each of the active area regions, the LDD regions having an outermost edge which abuts the field oxide region, and an innermost base terminus;
   after forming the LDD region, providing a photoresist mask over the field oxide and LDD regions, the photoresist mask having lateral outermost edges which are positioned in spaced relation relative to the respective interface edges, and within the respective active areas; and
   with the photoresist mask in place, ion implanting a conductivity enhancing dopant impurity into the active area regions to form source/drain diffusion regions which are individually associated with each of the respective field effect transistors, each of the source/drain regions having an outermost edge which is spaced from the respective interface edges of the field oxide, and an innermost base terminus, and where the innermost base terminus of the field oxide region is located between the innermost base terminus of the LDD diffusion region and innermost base terminus of the source/drain region.

7. A method for electrically isolating adjacent semiconductor diffusion regions, comprising:

providing a semiconductor substrate having given active area regions;

providing a buried oxide insulative device within the semiconductor substrate and located between two adjacent active area regions, the buried oxide insulative device defining an electrical isolation region between the two adjacent active area regions, and wherein each active area region joins with the buried oxide insulative device at respective interface edges, and wherein each of the active area regions, and the buried oxide insulative device have an innermost base terminus;

after providing the buried oxide insulative device, providing a LDD diffusion region associated with each active area region, and wherein each LDD region abuts the buried oxide insulative device, and further has an innermost base terminus;

after providing the LDD diffusion region, providing a layer of material over the substrate, buried oxide insulative device, and the LDD diffusion region;

after providing the layer of material, anisotropically etching the layer of material to provide spacers laterally outwardly of the buried oxide insulative device and over the LDD diffusion region; and after forming the spacers, ion implanting a conductivity enhancing dopant impurity into the substrate active area regions to form respective source/drain regions for each of the active area regions, and wherein each of the source/drain regions have an outermost edge received within the active area regions and spaced from the respective interface edges of the buried oxide insulative device, and further abutting the LDD diffusion region, and wherein the source/drain regions have an innermost base terminus, and wherein the buried oxide insulative mass innermost base terminus is located between the innermost base terminus of the LDD diffusion region and the innermost base terminus of source/drain diffusion region.

* * * * *